(12) United States Patent
Goeke

(10) Patent No.: US 12,265,115 B2
(45) Date of Patent: Apr. 1, 2025

(54) DIGITAL LOOP DUAL-STAGE SOURCE MEASURE UNIT

(71) Applicant: Keithley Instruments, LLC, Solon, OH (US)

(72) Inventor: Wayne C. Goeke, Hudson, OH (US)

(73) Assignee: Keithley Instruments, LLC, Solon, OH (US)

( * ) Notice: Subject to any disclaimer, the term of this patent is extended or adjusted under 35 U.S.C. 154(b) by 117 days.

(21) Appl. No.: 18/120,933

(22) Filed: Mar. 13, 2023

(65) Prior Publication Data
US 2023/0296660 A1 Sep. 21, 2023

Related U.S. Application Data
(60) Provisional application No. 63/321,068, filed on Mar. 17, 2022.

(51) Int. Cl.
*G01R 31/26* (2020.01)
(52) U.S. Cl.
CPC ..... *G01R 31/2601* (2013.01); *G01R 31/2607* (2013.01)
(58) Field of Classification Search
CPC ............ G01R 31/2601; G01R 31/2607; G01R 19/0092; G01R 31/31924; G01R 31/2841
USPC ......................................... 324/609, 602, 600
See application file for complete search history.

(56) References Cited

U.S. PATENT DOCUMENTS

| | | | |
|---|---|---|---|
| 5,579,236 A | 11/1996 | Tamamura et al. | |
| 7,903,008 B2 | 3/2011 | Regier | |
| 7,906,977 B1 | 3/2011 | Goeke et al. | |
| 8,456,338 B2 | 6/2013 | Regier et al. | |
| 8,604,765 B2 | 12/2013 | Regier et al. | |
| 8,653,840 B2 | 2/2014 | Regier et al. | |
| 8,797,025 B2 | 8/2014 | Regier et al. | |
| 9,274,145 B2 | 3/2016 | Goeke | |
| 10,001,521 B1 * | 6/2018 | Tsironis | G01R 1/045 |
| 2005/0285613 A1 * | 12/2005 | Isakharov | G01R 31/31924 324/762.02 |
| 2024/0248131 A1 * | 7/2024 | Sobolewski | G01R 31/2621 |

* cited by examiner

Primary Examiner — Giovanni Astacio-Oquendo
(74) Attorney, Agent, or Firm — Miller Nash LLP; Andrew J. Harrington; Krista Y. Chan

(57) ABSTRACT

A dual-stage source measure unit (SMU) has a user interface to allow a user to input one or more target values, at least two terminals to couple to a device under test (DUT), a current loop having a current digital control loop (DCL), a current digital-to-analog converter (DAC), a sense resistor, a current analog-to digital converter (ADC), and a common ADC, the current DCL to receive inputs from the current ADC, from the common ADC, and a target value for the output current, and to control a first output stage to produce the output current, and a voltage loop having a voltage DCL, a voltage DAC, a voltage ADC, and the common ADC, the voltage DCL to receive inputs from the voltage ADC, from the common ADC, and a target value for the output voltage, and to control a second output stage to produce the output voltage.

20 Claims, 4 Drawing Sheets

DIGITAL LOOP DUAL-STAGE SOURCE MEASURE UNIT

CROSS-REFERENCE TO RELATED APPLICATIONS

This disclosure claims benefit of U.S. Provisional Application No. 63/321,068, titled "DIGITAL LOOP DUAL-STAGE SOURCE MEASUREMENT UNIT," filed on Mar. 17, 2022, the disclosure of which is incorporated herein by reference in its entirety.

TECHNICAL FIELD

This disclosure relates to test and measurement instruments, and more particularly to a source measure unit (SMU).

BACKGROUND

Source measure unit (SMU) instruments precisely source voltage or current to a device under test (DUT), and simultaneously measure voltage and/or current. Generally, two types of SMUs exist, a single stage SMU and a dual stage SMU. In a single output stage design, the output stage delivers the voltage across the load and the sense resistor, $R_{sense}$. The load in many cases comprises a device under test (DUT), and the dimensions, including resistance, of the load are unknown. The sense resistor allows the SMU to be used to measure or force current.

Some single stage SMUs operate with a digital control loop, as shown in FIG. 1 The digital control loop generally involves some type of programmable control circuit and sets the voltage or current to a target setpoint. Analog-to-digital converters (ADC) measure the output voltage and current and the digital control loop drives a digital-to-analog converter (DAC) until the output voltage and/or current reaches the respective desired levels. The digital control loop receives the desired target value and adjusts the voltage provided by the DAC.

Dual stage SMUs, such as that shown in FIG. 2, allow for selection between sourcing or measuring a voltage across a load, usually a DUT, or a current across a sense resistor. One stage delivers the voltage across the sense resistor, which is measured as current, I, by V/R. A second output stage delivers the voltage across the load. Switches generally enable the device to select which stage is active. In FIG. 2, the switch settings will produce a voltage across the load. U.S. Pat. No. 7,906,977 shows an example of this type of SMU, the contents of which are incorporated herein by reference in their entirety.

All known SMUs currently available have a single digital control loop. None of them use two digital control loops to control either the voltage across the DUT or the current through the DUT.

DESCRIPTION

The embodiments here involve a dual-stage SMU using two digital control loops. The voltage sensing and the current sensing do not affect each other as in other SMU designs. This results from controlling the voltage between the device under test (DUT) and the current sensing to be regulated to be equal to the measurement system ground. This removes common mode measurement errors.

Figure 1:
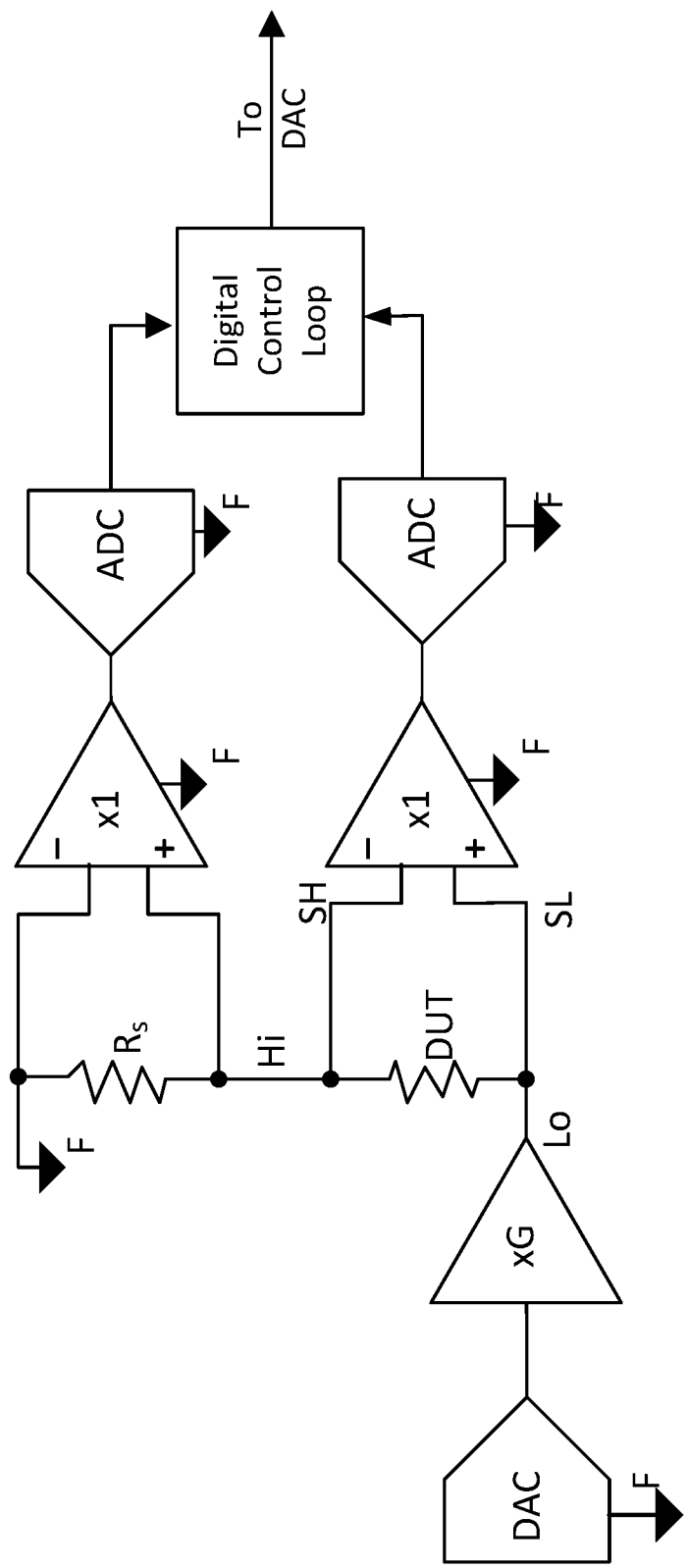
FIG. 1 shows an example of a single-stage digital loop SMU.
Figure 2:
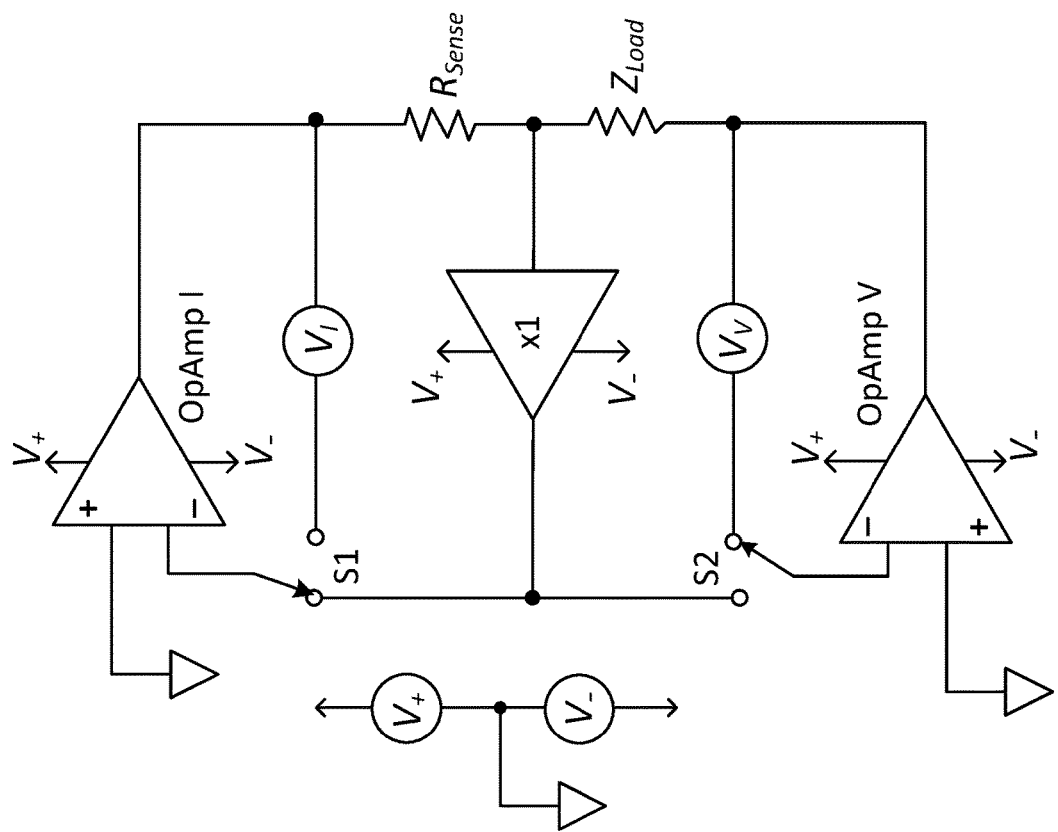
FIG. 2 shows an example of a dual-output stage SMU.
Figure 3:
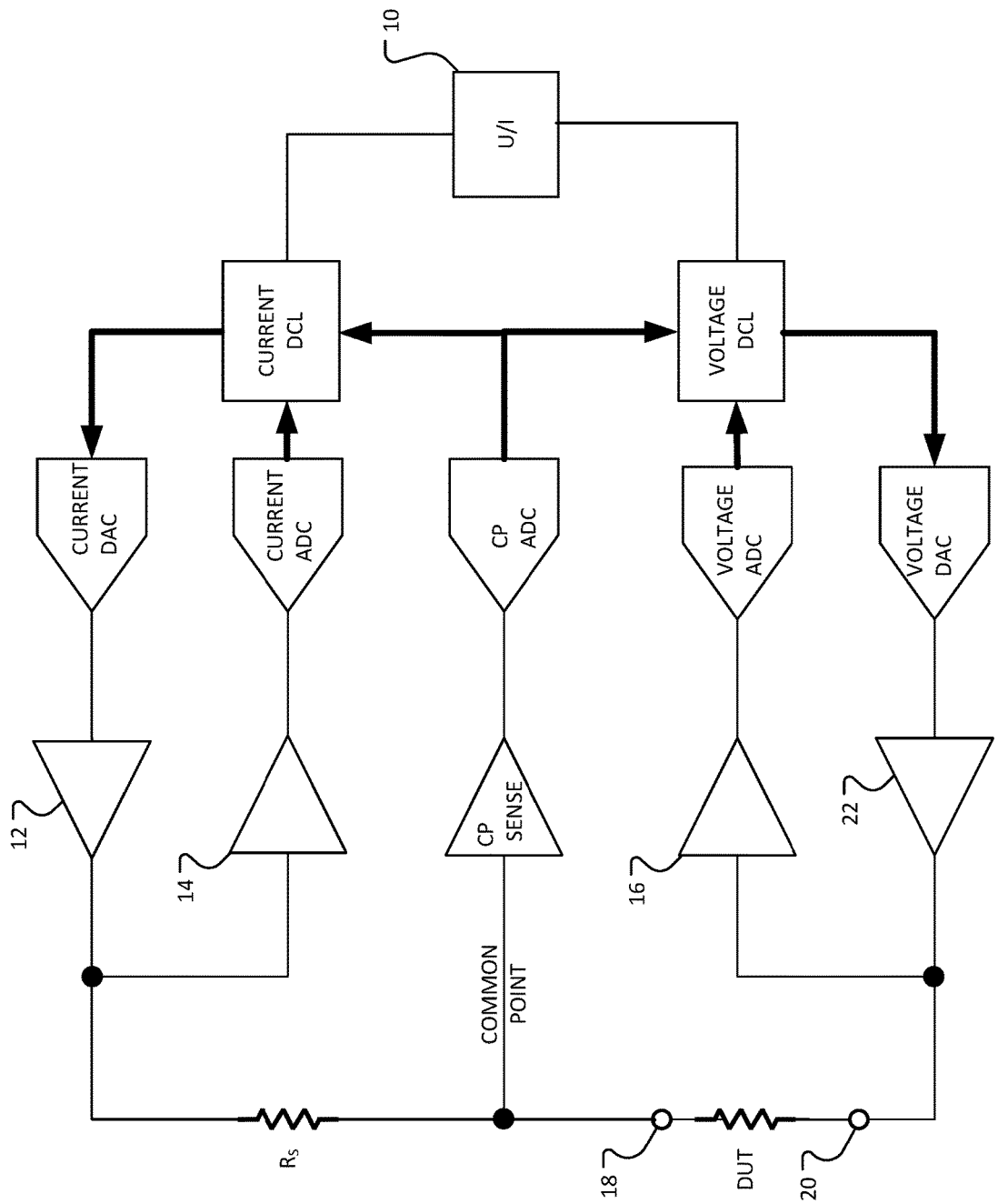
FIG. 3 shows an embodiment of a dual-output SMU with two digital control loops.

FIG. 3 shows an embodiment of a dual-stage SMU with two digital control loops. The term "digital control loop" and "DCL" means a device or circuit that can receive a number from an ADC, compare it to a target number and output a number to drive a digital-to-analog converter (DAC) to drive a voltage output, repeating this process to drive the number from the ADC to agree with the target number. This discussion will refer to this device as a processor or a controller, meaning a general-purpose processor, a digital signal processor, an Application Specific Integrated Circuit (ASIC), a field-programmable gate array (FPGA), or any other type of controller that can perform those functions.

The dual-stage SMU has two circuit loops in its architecture. The current loop comprises the Current DCL, a Current digital-to-analog converter (DAC), and a first output stage 12 that is controlled by the Current DCL. The current sense stage 14 provides feedback to the Current ADC of the voltage on $R_S$ which is proportional to the output current. The Current DCL receives three inputs: the voltage at the Common Point from the CP-ADC through the CP Sense stage; the output current from the Current ADC; and the target current from the user interface. The Current DCL controls the Current DAC to drive the first output stage 12 to source current matching the target current when the SMU is sourcing current, and to drive the first output stage to regulate the common point to zero voltage when the SMU is sourcing voltage.

Similarly, the voltage loop comprises a Voltage DCL, a Voltage DAC, and a second output stage 22 that is controlled by the Voltage DCL. The voltage sense stage 16 then provides the output voltage to the Voltage ADC. The Voltage DCL receives three inputs: the output voltage from the Voltage ADC; the voltage at the Common Point from the CP-ADC through the CP Sense amplifier; and the target voltage from the user interface. The Common Point, CP Sense amplifier, and the CP ADC are shared between the two loops. The Voltage DCL controls the Voltage DAC to drive the second output 22 stage to source voltage matching the target voltage when the SMU is sourcing voltage, and to drive the second output stage to regulate the common point to zero voltage when the SMU is sourcing current.

A user enters a target value comprising one or both of a target voltage number or a target current number through a user interface 10. The target voltage number may be a function of the current ADC values, and the target current number may be a function of the voltage ADC values. The user interface may comprise a touch screen that combines user controls with a display, or a display with separate knobs and buttons for inputs. As discussed in more detail below, the user may enter both voltage and current values, with one being the primary target and the other being a limit on the circuit operation as it tries to reach the primary target. The target value may consist of an upper value and a lower value as limits.

In addition, the Current ADC produces a first value that represents the output current, and the Voltage ADC produces a second value the represents the output voltage. The Current DCL and the Voltage DCL generate control signals to regulate a specified function of the output current and the output voltage, in addition to regulating one or the other discussed above. The specified function may be the output current, the output voltage, power, or resistance among many others.

The Voltage DCL forces a voltage across a first and second terminals 18 and 20 by driving the Voltage DAC to a value that causes voltage ADC to read the target voltage. In parallel to the Voltage DCL driving the Voltage DAC, to the target voltage, the Current DCL drives the Current DAC to a value that causes CP-ADC to read zero volts. The terminals 18 and 20 represent both source terminals and sense terminals for the SMU.

The terminals may comprise a pair of terminals configured to couple to a respective pair of nodes of the DUT to convey the analog output signal to the DUT. Alternatively, the terminals may comprise a first pair of source terminals configured to couple the respective pair of nodes of the DUT to convey the analog output signal to the DUT, and a second pair of sense terminals are coupled to respective inputs of the voltage ADC and configured to couple to the respective pair of nodes of the DUT through connections that carry negligible current. Typically, users can select on the SMU whether they want to use two or four terminals.

When the input comprises a target current instead of a target voltage, the Current DCL drives the Current DAC to cause the Current ADC to read a voltage equal to the current from the first terminal to the second terminal multiplied by the sense resistor $R_S$. In parallel, the Voltage DCL drives the Voltage DAC to a value that will cause the CP ADC to read zero Volts.

As discussed above, the user will typically input both a target voltage number and a target current number, with one or the other being the primary and the other being the limit. For example, the user may want to source 10 Volts, but does not want to draw more than 10 milliamps through the DUT. The digital control loops provide feedback as the voltage rises towards 10 V to monitor the current. If the current limit is reached before the target voltage is reached, the voltage will remain at whatever the voltage is at the current limit. Conversely, if the primary target is a current of 10 mA with a limit of 10 V, the loops will operate to drive the voltage across the sense resistor until 10 mA is reached, unless 10 V is reached first.

One aspect of the embodiments allows for a lower resolution ADC as the CP-ADC. Because the common point voltage is regulated to be zero, the CP Sense could be designed with a large gain. For example, the CP Sense stage could be a times 10 (10x) gain stage. If the input to the CP-ADC is 10 times greater, it reduces the step size of CP-ADC by a factor of 10 as far as its impact at the common point voltage. The impact of the noise, resolution, etc., is reduced in the downstream path, so a lower resolution ADC can be used in place of CP-ADC and still have the same step size.

This allows for a faster response time because the lower resolution ADCs can often be designed to sample faster. A faster CP-ADC can reduce issues that may result from there being a large difference between the resistance of the DUT and the sense resistor. For example, if the resistance of the DUT is 10 times higher than the resistance of the sense resistor, there will be a 10:1 attenuation when sourcing current brought into the common point feedback loop that reduces the bandwidth. If the signal is at 100 kHz, the resulting speed will be 10 kHz. Designing in a higher speed CP-ADC can alleviate this issue.

Figure 4:
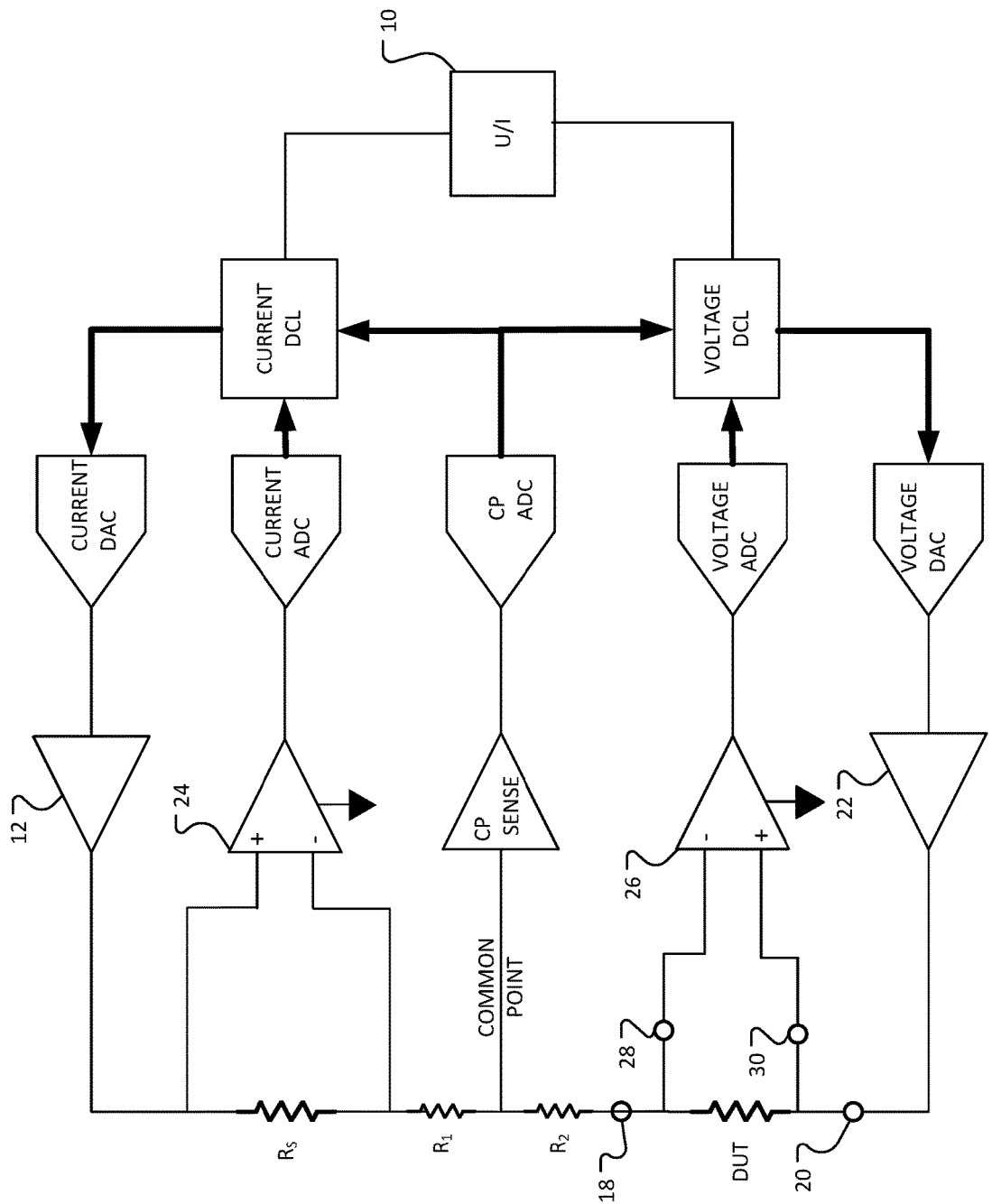
FIG. 4 shows another embodiment of a dual-output SMU with two digital control loops and differential sensing.

The diagram of FIG. 3 shows an ideal circuit in that it does not account for lead resistance when connecting to the DUT and resistance from the connection of circuit components. One way to manage lead resistance is to replace stages 14 and 16 with differential sensing stages 24 and 26, as shown in FIG. 4. $R_1$ represents the lead resistance between the common point and the current sense resistor, $R_S$. $R_2$ represents the lead resistance between the common point and source terminal 1. Additional resistance is usually in the lead from source terminal 1 and the DUT. Differential sensing overcomes these issues. Differentially sensing the DUT via sense terminals 28 and 30 at 26 solves the voltage sensing issue. Differentially sensing at 24 across $R_S$ solves the current sense issue. If the common point is moved to the lower end of $R_S$, then the differential sensing of $R_S$ may not be needed. Likewise, if the common point is moved to sense terminal 1 28, differential sensing of the DUT may not be needed.

Various modifications may exist. For example, voltage sensing stages 16 of FIG. 3, and 26 of FIG. 4 may have variable gain, where the gain may be less than or greater than 1, that is switchable to allow for sensing of a wider range of output voltages. The sense resistor $R_S$ may represent a plurality of switchable sense resistors to allow for sensing a wider range of current.

Aspects of the disclosure may operate on particularly created hardware, on firmware, digital signal processors, or on a specially programmed general-purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable, or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description refers to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

The previously described versions of the disclosed subject matter have many advantages that were either described or would be apparent to a person of ordinary skill. Even so, these advantages or features are not required in all versions of the disclosed apparatus, systems, or methods.

EXAMPLES

Illustrative examples of the disclosed technologies are provided below. An embodiment of the technologies may include one or more, and any combination of, the examples described below.

Example 1 is dual-stage source measure unit (SMU), comprising: a user interface to allow a user to input one or more target values; at least two terminals configured to couple to a device under test (DUT); a current loop comprising a current digital control loop (DCL), a current digital-to-analog converter (DAC), a sense resistor, a current analog-to digital converter (ADC), and a common ADC, the current DCL configured to receive inputs from the current ADC representing a value of an output current through the terminals, from the common ADC representing a value of a voltage of a common point, and a target value for the output current, and to control a first output stage by the current DAC to produce the output current; and a voltage loop comprising a voltage DCL, a voltage DAC, a voltage ADC, and the common ADC, the voltage DCL configured to receive inputs from the voltage ADC representing a value of an output voltage across the terminals, from the common ADC representing the value of the voltage of the common point, and a target value for the output voltage, and to control a second output stage by the voltage DAC to produce the output voltage.

Example 2 is the dual-stage SMU of Example 1, wherein, when the SMU is configured to source voltage, the current DCL is configured to control the first output stage to force the common point voltage to zero Volts and the voltage DCL is configured to control the second output stage to force a target output voltage across the terminals.

Example 3 is the dual-stage SMU of either Examples 1 or 2, wherein, when the SMU is configured to source current, the current DCL is configured to control the first output stage to force a target output current across the terminals, and the voltage DCL is configured to control the second output stage to force the common point voltage to zero Volts.

Example 4 is the dual-stage SMU of any of Examples 1 through 3, wherein an input to the voltage ADC is driven by a signal representing a differential voltage between the at least two terminals.

Example 5 is the dual-stage SMU of any of Examples 1 through 4, wherein the first output stage output drives through a sense resistor to a first of the at least two terminals.

Example 6 is the dual-stage SMU of any of Examples 1 through 5, wherein an input to the current ADC is driven by a signal representing a differential voltage across the sense resistor.

Example 7 is the dual-stage SMU of Example 6, wherein the second output stage drives a second of the at least two terminals.

Example 8 is the dual-stage SMU of any of Examples 1 through 7, wherein the at least two terminals comprise a first pair of terminals and a second pair of terminals, wherein the first pair of terminals are source terminals configured to couple to a pair of nodes of the DUT to convey the output current and output voltage to the DUT, and the second pair of terminals are sense terminals coupled to the voltage ADC and configured to couple to the pair of nodes of the DUT through connections that carry negligible current, and wherein the common point is located between the sense resistor and a first source terminal.

Example 9 is the dual-stage SMU of Example 8, wherein the common point is located at the sense resistor.

Example 10 is the dual-stage SMU of Example 8, where the common point is placed at a first sense terminal.

Example 11 is the dual-stage SMU of any of Examples 1 through 10, wherein at least one target value has an upper value and a lower value.

Example 12 is the dual-stage SMU of any of Examples 1 through 11, wherein the voltage DCL regulates a function of values of the voltage ADC and values of the current ADC to the one or more target values.

Example 13 is the dual-stage SMU of Example 3, wherein the current DCL regulates a function of values of the current ADC and values of the voltage ADC to the one or more target values.

Example 14 is the dual-stage SMU of any of Examples 1 through 13, wherein the one or more target values comprises a specified function of the current ADC and the voltage ADC and comprises one of resistance or power.

Example 15 is the dual-stage SMU of any of Examples 1 through 14, wherein one or both output stages have switchable variable gains.

Example 16 is the dual-stage SMU any of Examples 1 through 15, further comprising a plurality of the sense resistors switchable for sensing a wider range of current.

Example 17 is the dual-stage SMU of any of Examples 1 through 16, wherein one or both voltage sensing and current sensing have variable gains switchable for sensing a wider range of output voltage and or current.

Example 18 is a method of operating a source measure unit (SMU) having a voltage output stage coupled to terminals, and a current output stage coupled to a sense resistor, the method comprising: receiving inputs comprising an input from a current analog-to-digital converter (ADC) representing a value of an output current, a common ADC representing a voltage of a common point, and a target value for the output current, and using a current digital-to-analog controller (DAC) to control a first output stage to produce the output current, when the SMU is sourcing current; and receiving inputs comprising an input from a voltage ADC representing a value of an output voltage, the common ADC representing a voltage of the common point, and a target value for the output voltage, and using a voltage DAC to control a second output stage to produce the output voltage, when the SMU is sourcing voltage.

Example 19 is the method of Example 18, further comprising controlling the first output stage to force the common point voltage to zero Volts, and forcing the target output voltage across the terminals, when the SMU is configured to source voltage.

Example 20 is the method of Example 18, further comprising controlling the first output stage to force the target output current through the terminals, and controlling the second output stage to force the common point voltage to zero Volts, when the SMU is configured to source current.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A dual-stage source measure unit (SMU), comprising:
   a user interface to allow a user to input one or more target values;
   at least two terminals configured to couple to a device under test (DUT);
   a current loop comprising a current digital control loop (DCL), a current digital-to-analog converter (DAC), a sense resistor, a current analog-to digital converter (ADC), and a common ADC, the current DCL configured to receive inputs from the current ADC representing a value of an output current through the terminals, from the common ADC representing a value of a voltage of a common point, and a target value for the output current, and to control a first output stage by the current DAC to produce the output current; and
   a voltage loop comprising a voltage DCL, a voltage DAC, a voltage ADC, and the common ADC, the voltage DCL configured to receive inputs from the voltage ADC representing a value of an output voltage across the terminals, from the common ADC representing the value of the voltage of the common point, and a target value for the output voltage, and to control a second output stage by the voltage DAC to produce the output voltage.

2. The dual-stage SMU as claimed in claim 1, wherein, when the SMU is configured to source voltage, the current DCL is configured to control the first output stage to force the common point voltage to zero Volts and the voltage DCL is configured to control the second output stage to force a target output voltage across the terminals.

3. The dual-stage SMU as claimed in claim 1, wherein, when the SMU is configured to source current, the current DCL is configured to control the first output stage to force a target output current through the DUT, and the voltage DCL is configured to control the second output stage to force the common point voltage to zero Volts.

4. The dual-stage SMU as claimed in claim 1, wherein an input to the voltage ADC is driven by a signal representing a differential voltage between the at least two terminals.

5. The dual-stage SMU as claimed in claim 1, wherein the first output stage output drives through the sense resistor to a first of the at least two terminals.

6. The dual-stage SMU as claimed in claim 1, wherein an input to the current ADC is driven by a signal representing a differential voltage across the sense resistor.

7. The dual-stage SMU as claimed in claim 5, wherein the second output stage drives a second of the at least two terminals.

8. The dual-stage SMU as claimed in claim 1, wherein the at least two terminals comprise a first pair of terminals and a second pair of terminals, wherein the first pair of terminals are source terminals configured to couple to a pair of nodes of the DUT to convey the output current and output voltage to the DUT, and the second pair of terminals are sense terminals coupled to the voltage ADC and configured to couple to the pair of nodes of the DUT through connections that carry negligible current, and wherein the common point is located between the sense resistor and a first source terminal.

9. The dual-stage SMU as claimed in claim 8, wherein the common point is located at the sense resistor.

10. The dual-stage SMU as claimed in claim 8, where the common point is located at a first sense terminal.

11. The dual-stage SMU as claimed in claim 1, wherein at least one target value has an upper value and a lower value.

12. The dual-stage SMU as claimed in claim 1, wherein the voltage DCL regulates a function of values of the voltage ADC and values of the current ADC to the one or more target values.

13. The dual-stage SMU as claimed in claim 1, wherein the current DCL regulates a function of values of the current ADC and values of the voltage ADC to the one or more target values.

14. The dual-stage SMU as claimed in claim 1, wherein one of the one or more target values comprises a specified function of the current ADC and the voltage ADC and comprises one of resistance or power.

15. The dual-stage SMU as claimed in claim 1, wherein one or both output stages have switchable variable gains.

16. The dual-stage SMU as claimed in claim 1, wherein the sense resistor comprises a plurality of sense resistors switchable for sensing a wider range of current.

17. The dual-stage SMU as claimed in claim 1, wherein one or both voltage sensing and current sensing have variable gains switchable for sensing a wider range of output voltage or output current.

18. A method of operating a source measure unit (SMU) having a voltage output stage coupled to terminals, and a current output stage coupled to a sense resistor, the method comprising:
   receiving inputs comprising an input from a current analog-to-digital converter (ADC) representing a value of an output current, a common ADC representing a voltage of a common point, and a target value for the output current, and using a current digital-to-analog controller (DAC) to control a first output stage to produce the output current, when the SMU is sourcing current; and
   receiving inputs comprising an input from a voltage ADC representing a value of an output voltage, the common ADC representing a voltage of the common point, and a target value for the output voltage, and using a voltage DAC to control a second output stage to produce the output voltage, when the SMU is sourcing voltage.

19. The method as claimed in claim 18, further comprising controlling the first output stage to force the common point voltage to zero Volts, and forcing the target output voltage across the terminals, when the SMU is configured to source voltage.

20. The method as claimed in claim 18, further comprising controlling the first output stage to force the target output current through the terminals, and controlling the second output stage to force the common point voltage to zero Volts, when the SMU is configured to source current.

* * * * *